United States Patent
Takatsu et al.

(10) Patent No.: US 8,764,933 B2
(45) Date of Patent: Jul. 1, 2014

(54) ADHESIVE AND ADHESIVE SHEET

(75) Inventors: Tomomichi Takatsu, Gunma (JP); Masashi Kume, Gunma (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 379 days.

(21) Appl. No.: 13/256,801

(22) PCT Filed: Feb. 9, 2010

(86) PCT No.: PCT/JP2010/051869
§ 371 (c)(1),
(2), (4) Date: Sep. 15, 2011

(87) PCT Pub. No.: WO2010/106849
PCT Pub. Date: Sep. 23, 2010

(65) Prior Publication Data
US 2012/0000599 A1    Jan. 5, 2012

(30) Foreign Application Priority Data
Mar. 16, 2009    (JP) ................................. 2009-062191

(51) Int. Cl.
*C04B 37/00*    (2006.01)
(52) U.S. Cl.
USPC ........................................................ 156/325
(58) Field of Classification Search
CPC .................... C09J 4/00; C09J 133/08–133/12; C08F 20/06
USPC ........................................................ 156/325
See application file for complete search history.

(56) References Cited

U.S. PATENT DOCUMENTS

| 2003/0008140 A1* | 1/2003 | Takizawa et al. ....... 428/355 EP |
| 2007/0141330 A1* | 6/2007 | Morishima et al. ........... 428/343 |
| 2007/0196647 A1 | 8/2007 | Yokoyama et al. |

FOREIGN PATENT DOCUMENTS

| JP | 10 279907 | 10/1998 |
| JP | 2984549 | 11/1999 |
| JP | 2000 109771 | 4/2000 |
| JP | 2001 89731 | 4/2001 |
| JP | 2002 241708 | 8/2002 |
| JP | 2002 256234 | 9/2002 |
| JP | 2007 254711 | 10/2007 |
| JP | 2008 280375 | 11/2008 |

OTHER PUBLICATIONS

International Search Report Issued May 18, 2010 in PCT/JP10/051869 filed Feb. 9, 2010.

* cited by examiner

*Primary Examiner* — Michael Orlando
(74) *Attorney, Agent, or Firm* — Oblon, Spivak, McClelland, Maier & Neustadt, L.L.P.

(57) ABSTRACT

Provided is a adhesive and an adhesive sheet which exhibit excellent chip-holding properties during dicing and from which chips can be easily stripped during pick up, even when considering changes over time. It is a adhesive composition which contains both (A) a (meth)acrylic acid ester copolymer component that has functional-group containing monomer units and a weight average molecular weight of less than 350,000 and (B) a (meth)acrylic ester copolymer component that has functional-group containing monomer units and a weight average molecular weight of 350,000 to 2,000,000 at a weight ratio of 10:90 to 90:10, and further contains 0.5 to 20 parts by mass of a crosslinking agent per 100 parts by mass of components (A) and (B) in total, the crosslinking agent being a crosslinking agent that reacts with both the functional groups of the component (A) and the functional groups of the component (B).

8 Claims, No Drawings

ADHESIVE AND ADHESIVE SHEET

TECHNICAL FIELD

The present invention relates to an adhesive composition and an adhesive sheet.

BACKGROUND ART

In production processes of electronic parts such as IC's, for example, semiconductor wafers of a large diameter are diced, cleaned, dried and expanded while adhered to an adhesive sheet, then picked up and mounted. Adhesive compositions used for such adhesive sheets must have sufficient adherence to chips from the dicing step to the drying step, while being easily stripped from chips during pick up.

While Patent Document 1 discloses an energy ray curable pressure-sensitive adhesive composition that can be used for the above-mentioned purpose, further development of adhesive compositions with even better chip-holding properties during dicing and from which chips can be more easily separated during pick up has been desired.

On the other hand, Patent Document 2 proposes an adhesive composition in which two kinds of (meth)acrylic acid ester copolymers of different weight average molecular weights are used. The adhesive composition described in the document has excellent adhesion properties to the adhered object and bond durability, and is capable of following the expansion and contraction of substrates even under conditions of high temperatures and high humidity, but it does not satisfy the ease of stripping required of adhesive compositions used in the above-mentioned production processes of electronic parts.

Patent Document 1: Japanese Patent No. 2984549
Patent Document 2: JP-A 2001-89731

SUMMARY OF THE INVENTION

The present invention was achieved in view of the above-mentioned circumstances, with an object to provide an adhesive composition and adhesive sheet that have good adhesiveness as well as excellent strippability.

In particular, the object of the present invention is to provide an adhesive composition and adhesive sheet that have excellent chip-holding properties during dicing of a semiconductor wafer and allows easy stripping of chips during pick up.

In an aspect of the present invention, an adhesive composition comprising (A) a (meth)acrylic acid ester copolymer component which has a functional group-containing monomer unit and a weight average molecule weight of less than 350,000, and (B) a (meth)acrylic acid ester copolymer component which has a functional group-containing monomer unit and a weight average molecular weight of 350,000 to 2,000,000 at a weight ratio of 10:90 to 90:10, and further comprising 0.5 to 20 parts by mass of a crosslinking agent which reacts to both the functional group of said component (A) and the functional group of said component (B), with respect to 100 parts by mass of said component (A) and said component (B) in total is provided.

In an embodiment, the glass transition temperatures of the copolymer component (A) and copolymer component (B) are both at most 2° C. Moreover, in an embodiment, the functional groups of component (A) and component (B) are at least one group selected from the group consisting of hydroxyl group, carboxyl group, epoxy group, amide group, amino group, methylol group, sulfonate group, sulphamate group and phosphate (phosphite) ester group, and the crosslinking agent is selected from the group consisting of isocyanate compounds, epoxy compounds and imine compounds. For example, the functional group is a hydroxyl group and the crosslinking agent is an isocyanate compound. Additionally, in an embodiment, 10 to 95 mass % of the monomer units constituting component (A) are 2-ethylhexyl acrylate, and 10 to 95 mass % of the monomer units constituting component (B) are butyl acrylate.

In another aspect of the present invention, an adhesive sheet formed by applying the above-mentioned adhesive composition to a film substrate is provided. In an embodiment, the adhesive sheet is for wafer processing and is used in, for example, dicing or backgrinding processing. In another embodiment, the adhesive sheet is an adhesive sheet for surface protection that is to be stripped later.

In another further aspect of the present invention, a method for producing electronic parts in which the above-mentioned adhesive sheet is attached to an electronic part workpiece, the workpiece is processed, then the adhesive sheet is stripped from the workpiece is provided. In particular, a method for producing electronic parts in which the adhesive sheet is attached to an electronic parts assembly, the electronic parts assembly attached to the adhesive sheet is diced, then the adhesive sheet is stripped from each electronic part is provided.

In yet another further aspect of the present invention, a use of the above-mentioned adhesive composition or adhesive sheet for maintaining an electronic part workpiece or an electronic parts assembly during processing (e.g. dicing) of the electronic part workpiece or electronic parts assembly is provided.

MODES FOR CARRYING OUT THE INVENTION

In the present specification, a monomer unit means a constituting unit derived from a monomer. In the present specification, parts and % are by mass unless particularly described. Additionally, in the present specification, (meth) acrylate collectively refers to acrylates and methacrylates. Similarly, compounds containing the (meth) of (meth)acrylic acid etc. collectively refer to compounds that have and do not have "meth".

An adhesive composition according to one embodiment of the present invention is an adhesive composition comprising two kinds of (meth)acrylic acid ester copolymers having functional group-containing monomer units and different weight average molecular weights at a specific proportion, further comprising a crosslinking agent reactive to both functional groups, and comprising various additives as optional components.

<(Meth)Acrylic Acid Ester Copolymers Having Functional Group-Containing Monomer Units>

While a (meth)acrylic acid ester copolymer having a functional group-containing monomer unit means a copolymer obtained by polymerizing a (meth)acrylic acid ester monomer and a functional group-containing monomer, a monomer unit derived from a vinyl compound may be further included in addition to the (meth)acrylic acid ester monomer and functional group-containing monomer.

As the (A) (meth)acrylic acid ester copolymer component having a functional group-containing monomer unit, a copolymer with a weight average molecular weight in a range of less than 350,000 is used, and in one embodiment, one in a range of less than 250,000 (e.g. 200,000) is used. When the weight average molecular weight of component (A) is 350,000 or greater, the wettability with respect to an adhered object is insufficient, and chip flying occurs during dicing. While there are no particular limitations on the lower limit of the weight average molecular weight of component (A), when considering adhesion properties etc., for practical use, it is at least 50,000, preferably at least 100,000 and more preferably 150,000.

As the (B) (meth)acrylic acid ester copolymer component having a functional group-containing monomer unit, a copolymer with a weight average molecular weight in a range of 350,000 to 2,000,000 is used, and in one embodiment, one that is at least 400,000 (e.g. 600,000) and at most 1,800,000 (e.g. 1,500,000) is used. When the weight average molecular weight of component (B) is less than 350,000, the adhesive strength after tape attaching to an adhered object increases and the pick up properties become poorer overtime, and when it exceeds 2,000,000, the wettability with respect to the adhered object is insufficient, and chip flying occurs during dicing.

Additionally, the weight average molecular weights here are values measured as polystyrene-equivalent average molecular weights by gel permeation chromatography (GPC).

Moreover, the glass transition temperatures of the above-mentioned copolymer component (A) and above-mentioned copolymer component (B) are preferably at most 2° C., and those of at most −5° C. in particular may be favorably selected. This is because when the glass transition temperatures are too high, the adhesive hardens and chip flying may occur. Additionally, while there are no particular limitations to the lower limit of the glass transition temperatures, when they are too low, the adhesive is too soft and the adhesive may be stirred up during dicing. As such, −68° C. or higher, and as an example, −40° C., is preferable.

Here, the glass transition temperature is a value derived from the following Gordon-Tailor formula.

$$W/Tg = W_1/Tg_1 + W_2/Tg_2 + \ldots + W_n/Tg_n$$

Tg: glass transition temperature (° K) of (meth)acrylic acid ester copolymer $Tg_n$: glass transition temperature (° K) of a homopolymer of monomer n $W_n$: mass fraction (%) of monomer n Values published in manuals or the like may be used as the glass transition temperatures of homopolymers of monomers.

Examples of the (meth)acrylic acid ester monomers used in the above-mentioned component (A) and component (B) include, but are not limited to, butyl (meth)acrylate, 2-butyl (meth)acrylate, t-butyl (meth)acrylate, pentyl (meth)acrylate, octyl (meth)acrylate, 2-ethyl hexyl (meth)acrylate, nonyl (meth)acrylate, decyl (meth)acrylate, lauryl (meth)acrylate, methyl (meth)acrylate, ethyl (meth)acrylate, isopropyl (meth)acrylate, tridecyl (meth)acrylate, myristyl (meth)acrylate, cetyl (meth)acrylate, stearyl (meth)acrylate, cyclohexyl (meth)acrylate, isobornyl (meth)acrylate, dicyclopentanyl (meth)acrylate, benzyl (meth)acrylate, methoxy ethyl (meth) acrylate, ethoxy ethyl (meth)acrylate, butoxy methyl (meth) acrylate and ethoxy-n-propyl (meth)acrylate.

The functional group-containing monomers used in the above-mentioned component (A) and component (B) are monomer compounds copolymerized with the above-mentioned (meth)acrylic acid ester monomers, the monomer compounds comprising at least a functional group from the group consisting of hydroxyl group, carboxyl group, epoxy group, amide group, amino group, methylol group, sulfonate group, sulphamate group and phosphate (phosphite) ester group, e.g. vinyl compounds, may be mentioned.

Examples of functional group-containing monomers having a hydroxyl group include 2-hydroxyethyl (meth)acrylate, 2-hydroxypropyl (meth)acrylate, 2-hydroxybutyl (meth) acrylate and 2-hydroxyvinyl ether.

Examples of functional group-containing monomers having a carboxyl group include (meth)acrylic acid, crotonic acid, maleic acid, maleic anhydride, itaconic acid, fumaric acid, acrylamido N-glycolic acid and cinnamic acid.

Examples of functional group-containing monomers having an epoxy group include glycidyl (meth)acrylate.

Examples of functional group-containing monomers having an amide group include (meth)acrylamide.

Examples of monomers having an amino group include N,N-dimethylaminoethyl (meth)acrylate and N-t-butylaminoethyl (meth)acrylate.

Examples of functional group-containing monomers having a methylol group include N-methylol (meth)acrylamide.

As for the optional monomers derived from vinyl compounds in addition to the above-mentioned (meth)acrylic acid ester monomers and functional group-containing monomers that can be used to form the above-mentioned (meth)acrylic acid ester copolymers having functional group-containing monomer units, examples include ethylene, styrene, vinyl toluene, allyl acetate, vinyl propionate, vinyl butyrate, vinyl versate, vinyl ethyl ether, vinyl propyl ether, (meth)acrylonitrile and vinyl isobutyl ether.

The above-mentioned (meth)acrylic acid ester polymers having functional group-containing monomer units may be produced using a method conventionally known to those skilled in the art. For example, emulsion polymerization or solution polymerization can be appropriately used.

In one embodiment of the present invention, for the purpose of suppressing the wetting and spreading on an adhered object overtime as well, 10 to 95 mass % of the monomer units constituting the above-mentioned component (A) are preferably 2-ethylhexyl acrylate, and 10 to 95 mass % of the monomer units constituting the above-mentioned component (B) are preferably butyl acrylate.

Additionally, with respect to the proportion of the above-mentioned component (A) and above-mentioned component (B), the weight ratio (A:B) is selected to be within a range of 10:90 to 90:10. The wetting and spreading on an adhered object over time cannot be suppressed with too much or too little of the above-mentioned component (A).

<Crosslinking Agent>

The crosslinking agent used in the present invention is reactive with both the functional group of the functional group-containing monomer of the above-mentioned copolymer component (A) and the functional group of the functional group-containing monomer of the above-mentioned copolymer component (B), and can react with the functional groups of both copolymer components (A) and (B) to crosslink copolymer component (A) and copolymer component (B) under certain conditions, e.g. when heated. Examples of the crosslinking agent may include isocyanate compounds, epoxy compounds and imine compounds, and these compounds may be used alone or as a combination of two or more.

(Isocyanate Compounds)

Compounds having multiple isocyanate groups are used as isocyanate compounds. Examples of compounds having multiple isocyanate groups include aromatic isocyanates, alicyclic isocyanates and aliphatic isocyanates.

Examples of aromatic isocyanates include tolylene diisocyanate, 4,4-di phenyl methane diisocyanate and xylylene diisocyanate.

Examples of alicyclic isocyanates include isophorone diisocyanate and methylene-bis(4-cyclohexyl isocyanate).

Examples of aliphatic isocyanates include hexamethylene diisocyanate and trimethylhexamethylene diisocyanate.

These isocyanate compounds may be dimers or trimers, or they may be adducts obtained by reacting with a polyol compound.

(Epoxy Compounds)

Examples of epoxy compounds include bisphenol A epoxy compounds, bisphenol F epoxy compounds, N,N-glycidylaniline, N,N-glycidyl toluidine, m-N,N-glycidyl aminophenyl glycidyl ether, p-N,N-glycidyl aminophenyl glycidyl ether, triglycidylisocyanurate, N,N,N',N'-tetraglycidyl diamino diphenyl methane, N,N,N',N'-tetraglycidyl-m-xylylene diamine and N,N,N',N',N''-pentaglycidyl diethylene tri-amine.

(Imine Compounds)

Examples of imine compounds include N,N'-diphenylmethane-4,4'-bis(1-aziridinecarboxamide), trimethylol propane-tri-β-aziridinyl propionate, tetramethylol methane-tri-β-aziridinyl propionate, N,N'-toluene-2,4-bis-(1-aziridinecarboxamide) triethylene melamine.

The amount of the above-mentioned crosslinking agent added is within a range of 0.5 to 20 parts by mass, with respect to 100 parts by mass of the copolymer component (A) and copolymer component (B) in total. When the amount is less than 0.5 parts by mass, the adhesive strength of the adhesive is high and pick up errors occur, whereas when the amount exceeds 20 parts by mass, the adhesive strength is low, and chip flying occurs during dicing.

<Additives>

The adhesive composition may comprise various additives within a range not compromising the effect of the present invention.

For example, to adjust the adhesive strength, a tackifying resin may be added. The added tackifying resin is not particularly limited, and may be, for example, a rosin resin, a rosin ester resin, a terpene resin, a terpene phenolic resin, a phenolic resin, a xylene resin, a coumarone resin, a coumarone-indene resin, a styrene resin, an aliphatic petroleum resin, an aromatic petroleum resin, an aliphatic/aromatic copolymer petroleum resin, or an alicyclic hydrocarbon resin; or a modified form, a derivative or a hydrogenated form thereof. The amount of the tackifying resin added is not particularly limited, and may be at most 200 parts by mass, and preferably at most 30 parts by mass, with respect to 100 parts by mass of the above-mentioned (meth)acrylic acid ester copolymers.

Other additives may be, for example, polymerization initiators, softeners, antioxidants, fillers, ultraviolet absorbers, light stabilizers, photopolymerizable compounds and photo-initiators.

The thickness of the adhesive layer is preferably 1 to 100 μm and more preferably 5 to 40 μm. When the adhesive layer is thin, the adhesive strength is reduced, and chip-holding properties and stripping from ring frames during dicing may occur. When the adhesive layer is thick, the adhesive strength is high and poor pick up may occur.

<Adhesive Sheet>

An adhesive sheet is produced by applying the above-mentioned adhesive composition to one surface of a substrate film, and is used, for example, as an adhesive sheet for wafer processing in the dicing step.

The above-mentioned substrate film may be of a single layer or multiple layers, and the thickness thereof is preferably 30 to 300 μm, e.g. 60 to 200 μm. As the material of the substrate film, polyvinyl chloride, polyethylene terephthalate, ethylene/vinyl acetate copolymers, ethylene/acrylic acid/acrylic acid ester films, ethylene/ethylacrylate copolymers, polyethylenes, polypropylenes, ethylene/acrylic acid copolymers, and ionomer resins formed by crosslinking an ethylene/(meth)acrylic acid copolymer or an ethylene/(meth)acrylate/(meth)acrylic acid ester copolymer etc. using a metal ion may be specifically mentioned. Among ionomer resins, ionomer resins in which copolymers having ethylene units, (meth)acrylic acid units and alkyl (meth)acrylate ester units are crosslinked by a metal ion such as $Na^+$, $K^+$ or $Zn^{2+}$ excel in suppression of shaving sawdust occurrence and have excellent expandability, which has become desirable in recent years, and are therefore particularly preferable.

The method for forming a substrate film is not particularly limited, and may be, for example, a calendar molding method, T-die extrusion method, inflation method or casting method.

Moreover, in order to prevent static electricity when stripping off a release film from the substrate film, an anti-static treatment may be applied to the surface in contact and/or the surface not in contact with the adhesive of the substrate film, and in order to improve expandability after dicing, a slip agent may be used to provide slipping properties to the surface not in contact with the adhesive.

Examples of anti-static agents include quaternary amine salt monomers, more specifically dimethylaminoethyl (meth)acrylate quaternary chloride, diethylaminoethyl (meth)acrylate quaternary chloride, methylethylaminoethyl (meth)acrylate quaternary chloride, p-dimethylamino styrene quaternary chloride and p-diethylamino styrene quaternary chloride, and dimethylaminoethyl methacrylate quaternary chloride is particularly preferable.

The slip agent is not particularly limited as long as it is a substance capable of lowering the coefficient of friction between the adhesive sheet and an expanding apparatus, and examples include silicone compounds such as silicone resins and (modified) silicone oils, fluororesins, hexagonal boron nitride crystals, carbon black and molybdenum disulfide. These slip agents may be mixtures of multiple components. Moreover, since the production of electronic parts is carried out in a clean room, it is preferable to use a silicone compound or fluororesin, and among silicone compounds, copolymers having silicone macromonomer units in particular have good compatibility with anti-static layers and a balance of anti-static properties and expandability, and are therefore favorably used.

The methods for applying the anti-static treatment and for providing slipping properties are not particularly limited. An anti-static agent may be applied to the surface of the substrate film coated with the adhesive and/or the back side thereof, and a slip agent to the back side thereof, or an anti-static agent and/or a slip agent may be mixed into the resin of the substrate film, which is then made into a sheet.

Additionally, by making the back side of the surface of the substrate film coated with the adhesive an embossed surface having an average surface roughness (Ra) of 0.3 to 1.5 μm and placing the embossed surface on the side of the machine table of an expanding apparatus, the substrate film can expand easily in the expanding step after dicing.

As the method for forming an adhesive layer on one surface of the substrate film to produce an adhesive sheet, there are, for example, methods in which the adhesive is directly coated on the substrate film using a coater such as gravure coater, comma coater, bar coater, knife coater or roll coater and methods in which the adhesive is coated and dried on a release film, which is then applied to the substrate film. The adhesive may be printed on the substrate film by relief printing, intaglio printing, planographic printing, flexographic printing, offset printing or screen printing. The thickness of the adhesive layer is not limited, but the thickness after drying is preferably approximately 1 to 100 μm and more preferably 5 to 40 μm.

In the above, the adhesive sheet is used in a production process of electronic parts in which the adhesive sheet is attached to an electronic parts assembly such as a semiconductor wafer, the electronic parts assembly attached to the adhesive sheet is diced, and then the adhesive sheet is stripped from each electronic part such as a chip. However, the adhesive sheet of the present invention can also be used in the backgrinding process of a semiconductor wafer, and as such, can be used widely in a production process of electronic parts in which the adhesive sheet is attached to an electronic part workpiece, the workpiece is processed, and then the adhesive sheet is stripped from the workpiece. Furthermore, as long as the intended use requires stripping after attaching, the adhesive sheet is not limited to one for semiconductor wafer processing, and may also be used, for example, as a sheet for protecting the surface of a product such as a polarizing plate, or for purposes of transferring or transporting diced chips.

EXAMPLES

Herebelow, the present invention shall be explained in more detail with reference to examples, but the present invention is not limited to these examples.
<Materials Used>
The following seven types of copolymers A-1 to A-7* and the following eight types of copolymers B-1 to B-8* were respectively produced as (A) (meth) acrylic acid ester copolymer components of a low weight average molecular weight and as (B) (meth)acrylic acid ester copolymer components of a high weight average molecular weight, and used with the following crosslinking agent. Moreover, the following product made of an ionomer resin was used as a substrate film. Additionally, in the descriptions above and below, "*" indicates being outside the scope of the invention.
(Meth)acrylic acid ester copolymer component A-1:
Copolymer of 55 mass % 2-ethylhexyl acrylate, 40 mass % methyl methacrylate and 5 mass % 2-hydroxyethyl acrylate; Tg=−20.6° C.; weight average molecular weight: 150,000
(Meth)acrylic acid ester copolymer component A-2:
Copolymer of 55 mass % 2-ethylhexyl acrylate, 40 mass % methyl methacrylate and 5 mass % 2-hydroxyethyl acrylate; Tg=−20.6° C.; weight average molecular weight: 100,000
(Meth)acrylic acid ester copolymer component A-3:
Copolymer of 55 mass % 2-ethylhexyl acrylate, 40 mass % methyl methacrylate and 5 mass % 2-hydroxyethyl acrylate; Tg=−20.6° C.; weight average molecular weight: 300,000
(Meth)acrylic acid ester copolymer component A-4:
Copolymer of 15 mass % 2-ethylhexyl acrylate, 80 mass % methyl acrylate and 5 mass % 2-hydroxyethyl acrylate; Tg=−8.4° C.; weight average molecular weight: 150,000
(Meth)acrylic acid ester copolymer component A-5:
Copolymer of 90 mass % 2-ethylhexyl acrylate, 5 mass % methyl methacrylate and 5 mass % 2-hydroxyethyl acrylate; Tg=−62.9° C.; weight average molecular weight: 150,000
(Meth)acrylic acid ester copolymer component A-6:
Copolymer of 2 mass % 2-ethylhexyl acrylate, 93 mass % methyl acrylate and 5 mass % 2-hydroxyethyl acrylate; Tg=4.6° C.; weight average molecular weight: 150,000
(Meth)acrylic acid ester copolymer component A-7*:
Copolymer of 55 mass % 2-ethylhexyl acrylate, 40 mass % methyl methacrylate and 5 mass % 2-hydroxyethyl acrylate; Tg=−20.6° C.; weight average molecular weight: 500,000

The following eight types of copolymers B-1 to B-8* were produced and used as (B) (meth)acrylic acid ester copolymer components of a high weight average molecular weight.
(Meth)acrylic acid ester copolymer component B-1:
Copolymer of 50 mass % butyl acrylate, 45 mass % ethyl acrylate and 5 mass % 2-hydroxyethyl acrylate; Tg=−39.4° C.; weight average molecular weight: 800,000
(Meth)acrylic acid ester copolymer component B-2:
Copolymer of 50 mass % butyl acrylate, 45 mass % ethyl acrylate and 5 mass % 2-hydroxyethyl acrylate; Tg=−39.4° C.; weight average molecular weight: 1,500,000
(Meth)acrylic acid ester copolymer component B-3:
Copolymer of 50 mass % butyl acrylate, 45 mass % ethyl acrylate and 5 mass % 2-hydroxyethyl acrylate; Tg=−39.4° C.; weight average molecular weight: 400,000
(Meth)acrylic acid ester copolymer component B-4:
Copolymer of 90 mass % butyl acrylate, 5 mass % methyl methacrylate and 5 mass % 2-hydroxyethyl acrylate; Tg=−48.5° C.; weight average molecular weight: 800,000
(Meth)acrylic acid ester copolymer component B-5:
Copolymer of 15 mass % butyl acrylate, 80 mass % methyl acrylate and 5 mass % 2-hydroxyethyl acrylate; Tg=−4.8° C.; weight average molecular weight: 800,000
(Meth)acrylic acid ester copolymer component B-6:
Copolymer of 2 mass % butyl acrylate, 93 mass % methyl acrylate and 5 mass % 2-hydroxyethyl acrylate; Tg=5.2° C.; weight average molecular weight: 800,000
(Meth)acrylic acid ester copolymer component B-7*:
Copolymer of 50 mass % butyl acrylate, 45 mass % ethyl acrylate and 5 mass % 2-hydroxyethyl acrylate; Tg=−39.4° C.; weight average molecular weight: 200,000
(Meth)acrylic acid ester copolymer component B-8*:
Copolymer of 50 mass % butyl acrylate, 45 mass % ethyl acrylate and 5 mass % 2-hydroxyethyl acrylate; Tg=−39.4° C.; weight average molecular weight: 2,200,000

Crosslinking agent: trimethylol propane adduct of 2,4-tolylene diisocyanate; commercially available Substrate film: ionomer resin in which the main component is a Zn salt of an ethylene/methacrylic acid/alkyl methacrylate ester copolymer; MFR value: 1.5 g/10 min (JIS K7210, 210° C.); melting point: 96° C.; contains $Zn^{2+}$ ion; manufactured by Du Pont-Mitsui Polychemicals Co., Ltd.; commercially available <Production of Adhesive Compositions and Adhesive Sheets>

(Meth)acrylic acid ester copolymer components A-1 to A-6, (meth)acrylic acid ester copolymer components B-1 to B-6 and the crosslinking agent were mixed at respective proportions shown in Table 1 to prepare each of the adhesive compositions of the present invention according to Examples 1-11 and comparative adhesive compositions according to Comparative Examples 1-7.

Each adhesive composition was coated on a release film made of PET such that the thickness of the adhesive layer after drying is 10 μm, and laminated onto a substrate film made of an ionomer resin of 100 μm to obtain each adhesive sheet.

TABLE 1

|  | Examples | | | | | | | | |
|---|---|---|---|---|---|---|---|---|---|
|  | 1 | 2 | 3 | 4 | 5 | 6 | 7 | 8 | 9 |
| A-1 | 50 | | | 85 | 15 | 50 | 50 | | |
| A-2 | | 50 | | | | | | | |
| A-3 | | | 50 | | | | | | |
| A-4 | | | | | | | | 50 | |
| A-5 | | | | | | | | | 50 |
| A-6 | | | | | | | | | |
| A-7* | | | | | | | | | |
| weight average molecular weight (thousand) | 150 | 100 | 300 | 150 | 150 | 150 | 150 | 150 | 150 |
| glass transition temperature (° C.) | −20.6 | −20.6 | −20.6 | −20.6 | −20.6 | −20.6 | −20.6 | −8.4 | −62.9 |
| 2-ethylhexyl acrylate (mass %) | 55 | 55 | 55 | 55 | 55 | 55 | 55 | 15 | 90 |
| B-1 | 50 | | | 15 | 85 | 50 | 50 | | |
| B-2 | | 50 | | | | | | | |
| B-3 | | | 50 | | | | | | |
| B-4 | | | | | | | | 50 | |
| B-5 | | | | | | | | | 50 |
| B-6 | | | | | | | | | |
| B-7* | | | | | | | | | |
| B-8* | | | | | | | | | |
| weight average molecular weight (thousand) | 800 | 1500 | 400 | 800 | 800 | 800 | 800 | 800 | 800 |
| glass transition temperature (° C.) | −39.4 | −39.4 | −39.4 | −39.4 | −39.4 | −39.4 | −39.4 | −48.5 | −4.8 |
| butyl acrylate (mass %) | 50 | 50 | 50 | 50 | 50 | 50 | 50 | 90 | 15 |
| weight ratio of component (A) component (B) | 50:50 | 50:50 | 50:50 | 85:15 | 15:85 | 50:50 | 50:50 | 50:50 | 50:50 |
| crosslinking agent (parts by mass) | 10 | 10 | 10 | 10 | 10 | 1 | 18 | 10 | 10 |
| adhesive strength with respect to silicon wafer (normal state) N/20 mm | 0.80 | 0.60 | 1.00 | 1.00 | 0.70 | 1.00 | 0.60 | 0.60 | 1.10 |
| increase in adhesive strength over time | AA | AA | AA | AA | AA | AA | AA | A | A |
| chip-holding properties | A | A | A | A | A | A | A | A | A |
| pick up properties | A | A | A | A | A | A | A | A | A |
| overall evaluation | AA | AA | AA | AA | AA | AA | AA | A | A |

|  | Examples | | Comparative Examples | | | | | | |
|---|---|---|---|---|---|---|---|---|---|
|  | 10 | 11 | 1 | 2 | 3 | 4 | 5 | 6 | 7 |
| A-1 | | 50 | | 50 | 50 | 5* | 95* | 50 | 50 |
| A-2 | | | | | | | | | |
| A-3 | | | | | | | | | |
| A-4 | | | | | | | | | |
| A-5 | | | | | | | | | |
| A-6 | 50 | | | | | | | | |
| A-7* | | | 50 | | | | | | |
| weight average molecular weight (thousand) | 150 | 150 | 500* | 150 | 150 | 150 | 150 | 150 | 150 |
| glass transition temperature (° C.) | 4.6 | −20.6 | −20.6 | −20.6 | −20.6 | −20.6 | −20.6 | −20.6 | −20.6 |
| 2-ethylhexyl acrylate (mass %) | 2 | 55 | 55 | 55 | 55 | 55 | 55 | 55 | 55 |
| B-1 | 50 | | 50 | | | 95* | 5* | 50 | 50 |
| B-2 | | | | | | | | | |
| B-3 | | | | | | | | | |
| B-4 | | | | | | | | | |
| B-5 | | | | | | | | | |
| B-6 | | 50 | | | | | | | |
| B-7* | | | | 50 | | | | | |
| B-8* | | | | | 50 | | | | |
| weight average molecular weight (thousand) | 800 | 800 | 800 | 200* | 2200* | 800 | 800 | 800 | 800 |
| glass transition temperature (° C.) | −39.4 | 5.2 | −39.4 | −39.4 | −39.4 | −39.4 | −39.4 | −39.4 | −39.4 |
| butyl acrylate (mass %) | 50 | 2 | 50 | 50 | 50 | 50 | 50 | 50 | 50 |
| weight ratio of component (A) component (B) | 50:50 | 50:50 | 50:50 | 50:50 | 50:50 | 5:95 | 95:5 | 50:50 | 50:50 |
| crosslinking agent (parts by mass) | 10 | 10 | 10 | 10 | 10 | 10 | 10 | 0.1* | 25* |
| adhesive strength with respect to silicon wafer (normal state) N/20 mm | 1.00 | 0.90 | 0.30 | 1.20 | 0.30 | 0.50 | 1.00 | 1.20 | 0.30 |

TABLE 1-continued

| | | | | | | | | | |
|---|---|---|---|---|---|---|---|---|---|
| increase in adhesive strength over time | A | A | A | B | A | B | B | A | A |
| chip-holding properties | A | A | B | A | B | A | A | A | B |
| pick up properties | A | A | A | A | A | A | A | B | A |
| overall evaluation | A | A | B | B | B | B | B | B | B |

<Dicing and Expanding>

Each produced adhesive sheet was attached to a silicon wafer (6 inches) with a thickness of 725 μm, and diced to 3 mm×3 mm sized chips. The depth of the cut into the adhesive sheets during dicing was 30 μm.

Moreover, the dicing conditions were as follows.
Dicing apparatus: DAD341, manufactured by DISCO Inc.
Dicing blade: G1A851SD400R13B01, manufactured by DISCO Inc.
Dicing blade rotation speed: 40,000 rpm
Dicing blade feed rate: 40 mm/sec.
Water temperature for cutting: 25° C.
Amount of water for cutting: 1.0 L/min.

Further, after dicing the silicon wafers, expanding was performed. The expanding conditions were as follows.
Expanding apparatus: Electronics HS-1800, manufactured by Hugle Electronics Inc.
Pull-down stroke: 20 mm
Pull-down speed: 20 mm/sec.
Heating condition: 40° C.×1 min.

<Evaluation of Adhesive Compositions and Adhesive Sheets>

Each adhesive sheet was evaluated according to the following procedures for adhesive strength with respect to silicon wafers, increase in adhesive strength over time, chip-holding properties and pick up properties, and the results were included in the abovementioned Table 1.

(Adhesive Strength with Respect to Silicon Wafers)

Adhesive sheets were attached to the mirror surface of silicon wafers, compressed back and forth once with a 2 kg roller, left for 20 minutes, then measured for adhesive strength under conditions of 180° peeling and a pulling speed of 300 mm/min.

(Increase in Adhesive Strength Over Time)

Test samples attached under the above conditions then left for 20 minutes and test samples left for seven days were produced, and adhesive strength X of the test samples left for 20 minutes and adhesive strength Y of the test samples left for seven days were respectively measured, and the rate of increase was obtained using the following equation:

$$\text{Rate of increase} = (100 \times (Y-X))/X$$

Moreover, the increase in adhesive strength over time was evaluated in accordance with the following evaluation criteria.
  AA (excellent): rate of increase was less than 5%.
  A (good): rate of increase was at least 5% and less than 10%.
  B (poor): rate of increase was at least 10%.

(Chip-Holding Properties)

When dicing the silicon wafers under the abovementioned conditions, the number of chips retained on the adhesive sheets was examined, and chip-holding properties were evaluated in accordance with the following evaluation criteria.
  A (good): at least 90% of chips retained on adhesive sheet.
  B (poor): less than 90% of chips retained on adhesive sheet.

(Pick Up Properties)

After dicing and expanding the silicon wafers under the abovementioned conditions, the number of chips that could be picked up was examined, and pick up properties were evaluated in accordance with the following evaluation criteria.
  A (good): at least 80% of chips could be picked up.
  B (poor): less than 80% of chips could be picked up.

As seen from Table 1, the adhesive sheets of Examples 1 to 11 produced excellent evaluation results for all the properties tested. In contrast, Comparative Examples 1 and 3, in which the weight average molecular weight of either component (A) or component (B) was too high, had insufficient adhesive strength and poor chip-holding properties, and the adhesive sheets of Comparative Example 2, in which the weight average molecular weight of component (B) was too low, and those of Comparative Examples 4 and 5, in which the proportions of component (A) and component (B) were outside the specifications, had rates of increase in adhesive strength that became higher overtime (and thus had poor pick up properties over time). Additionally, the adhesive sheet of Comparative Example 6 with a low amount of crosslinking agent added had poor pick up properties, whereas the adhesive sheet of Comparative Example 7 with a high amount of crosslinking agent added had poor chip-holding properties.

Industrial Applicability

The adhesive composition and adhesive sheet of the present invention have excellent chip-holding properties during dicing and allow easy stripping of chips during pick up even when considering changes over time, and are therefore suitable for adhesive sheets for wafer processing and may also be used for adhesive sheets for surface protection where stripping is a prerequisite.

The invention claimed is:

1. A method for producing an electronic part, comprising:
   attaching an adhesive sheet to an electronic parts assembly, wherein the adhesive sheet is formed by applying an adhesive composition on a substrate film;
   dicing the electronic parts assembly attached to the adhesive sheet; and then
   stripping the adhesive sheet from each electronic part,
   wherein the adhesive composition comprises (A) a (meth) acrylic acid ester copolymer component which has a functional group-containing monomer unit and a weight average molecule weight of less than 350,000, and (B) a (meth)acrylic acid ester copolymer component which has a functional group-containing monomer unit and a weight average molecular weight of 350,000 to 2,000,000, at a weight ratio of 10:90 to 90:10, and further comprises 0.5 to 20 parts by mass of a crosslinking agent which reacts with both the functional group of said component (A) and the functional group of said component (B), with respect to 100 parts by mass of said component (A) and said component (B) in total.

2. The method of claim 1, wherein the glass transition temperatures of said component (A) and said component (B) are both at most 2° C.

3. The method of claim 1, wherein said functional groups of said component (A) and said component (B) are at least one group selected from the group consisting of hydroxyl group, carboxyl group, epoxy group, amide group, amino group, methylol group, sulfonate group, sulphamate group, phosphite ester group and phosphate ester group, and said crosslinking agent is selected from the group consisting of isocyanate compounds, epoxy compounds and imine compounds.

4. The method of claim 1, wherein 10 to 95 mass % of the monomer units constituting said component (A) are 2-ethylhexyl acrylate, and 10 to 95 mass % of the monomer units constituting said component (B) are butyl acrylate.

5. The method of claim 1, wherein the adhesive sheet is suitable as an adhesive sheet for wafer processing.

6. The method according to claim 2, wherein said functional groups of said component (A) and said component (B) are at least one group selected from the group consisting of hydroxyl group, carboxyl group, epoxy group, amide group, amino group, methylol group, sulfonate group, sulphamate group, phosphite ester group and phosphate ester group, and said crosslinking agent is selected from the group consisting of isocyanate compounds, epoxy compounds and imine compounds.

7. The method of claim 2, wherein 10 to 95 mass % of the monomer units constituting said component (A) are 2- ethylhexyl acrylate, and 10 to 95 mass % of the monomer units constituting said component (B) are butyl acrylate.

8. The method of claim 3, wherein 10 to 95 mass % of the monomer units constituting said component (A) are 2-ethylhexyl acrylate, and 10 to 95 mass % of the monomer units constituting said component (B) are butyl acrylate.

\* \* \* \* \*